United States Patent [19]
Okajima et al.

[11] Patent Number: 5,381,753
[45] Date of Patent: Jan. 17, 1995

[54] FABRICATION METHOD OF FINE STRUCTURES

[75] Inventors: Michio Okajima, Neyagawa; Osamu Kusumoto, Sakai; Takao Tohda, Ikoma; Kazuo Yokoyama, Hirakata; Motoshi Shibata, Hirakata, all of Japan

[73] Assignee: Matsushita Electric Industrial Co., Ltd., Kadoma, Japan

[21] Appl. No.: 55,728

[22] Filed: Apr. 30, 1993

[30] Foreign Application Priority Data

Apr. 30, 1992 [JP] Japan .................. 4-111125

[51] Int. Cl.⁶ .......................................... C30B 23/00
[52] U.S. Cl. ...................... 117/12; 117/931; 117/935; 117/921; 117/938
[58] Field of Search ............... 136/600, 609, DIG. 64, 136/DIG. 101, DIG. 112; 117/12, 931, 935, 921, 938

[56] References Cited

U.S. PATENT DOCUMENTS

| | | | |
|---|---|---|---|
| 3,580,732 | 5/1971 | Blakeslee et al. | 156/609 |
| 3,632,405 | 1/1972 | Knippenberg et al. | 156/609 |
| 3,635,753 | 1/1972 | Arthur et al. | 156/609 |
| 4,058,418 | 11/1977 | Lindmayer | 156/609 |
| 4,099,986 | 7/1978 | Diepers | 156/609 |

FOREIGN PATENT DOCUMENTS 4-130733  5/1992  Japan .

OTHER PUBLICATIONS

Wagner et al., "The Vapor–Liquid Solid Mechanism of Crystal Growth and Its Application to Silicon", Transactions of the Metallurgical Society of AIME vol. 233 Jun. 1965 pp. 1053–1064.

R. S. Wagner & W. C. Ellis, "Vapor–Liquid–Solid Mechanism of Single Crystal Growth", *Applied Physics Letters*, vol. 4, No. 5, pp. 89–90 (Mar. 1964).

*Primary Examiner*—Robert Kunemund
*Attorney, Agent, or Firm*—Ratner & Prestia

[57] ABSTRACT

A fabrication method provides fine structures which have few carrier trap centers and light absorption levels and find applications in quantum wires and quantum boxes having arbitrary configurations at least within a two-dimensional plane. The fabrication method comprises the steps of having a sharp tip held in close proximity to the surface of a substrate 1 and having a metal constituting the tip evaporated from the top. Alternatively, a metal contained in ambient vapor or a solution decomposed by a tunnel current or the like is provided. The metal is deposited locally on the substrate surface. A finely structured crystal is grown on the locally deposited region by a vapor phase-liquid phase-solid phase reaction.

39 Claims, 4 Drawing Sheets

FABRICATION METHOD OF FINE STRUCTURES

BACKGROUND OF THE INVENTION

The present invention relates to a fabrication method of fine structures to be used in quantum effect devices or the like.

When the structure of a material becomes finer than the phase coherent length of electrons in the material, more specifically, than the magnitude of about 100 nanometers (nm) to several micrometers (um) in the case of a semiconductor, the behavior of the electrons in the material will start to show electron wave inteference effects that cannot be observed with the electrons in a bulk material.

In other words, as the structure of the material becomes finer than the de Broglie wave length (several tens of nm), various accompanying effects (such as the tunnel effect, the effect due to quantum level formation, the effect due to mini-zone formation or the like) will be showing up with the electrons of the material. These effects are generally referred to as the quantum effects.

In recent years, studies have been made to realize devices by making use of these effects.

As a result, use of a film formation technique of atomic scale such as the molecule beam epitaxial growth method or the like has so far resulted in creation of a good semiconductor superlattice structure and a modulation dope structure, leading to realization of high electron mobility transistor (HEMT), heterojunction bipolar transistor (HBT), multi-quantum well (MQW) lasers or the like.

All of these are made from fine structures wherein freedom of electrons in the stacking direction of the semiconductor layer is restricted.

On the other hand, various studies have been conducted to realize super high speed transistors, super low threshold lasers or the like. In these studies, such effects as a scatter vanishing effect of electrons, an effect reflecting the electron's discrete density of states or the like (e.g., the effect due to so called two-dimensional electron systems and three dimensional electron systems) are utilized through creation of a quantum wire or a quantum box to enhance the dimension of the restriction imposed on the freedom of electrons to a two-dimensional or three-dimensional level.

There have been so far devised a variety of methods of making a quantum wire or a quantum box including: (1) a method to form a potential barrier by either removing or making mixed crystal of a portion of the superlattice structure by means of focused ion beam or the like after formation of a superlattice structure, (2) a method of half atom alternate epitaxy applied on an off-orientation substrate, and (3) a method making use of crystal orientation dependence in crystal growth speed as observed in facet growth and in crystal growth inside channels formed on a substrate.

However, prior art method (1) to form a potential barrier (by either removing or making mixed crystal of a portion of the superlattice structure by means of focused ion beam or the like after formation of the superlattice structure) had the problems that the interface steepness was not sufficient due to the mutual diffusion of the constituting atoms. The carrier trap center density in the interface became large on account of lattice defects or the like caused during processing. Particularly, with an optical device or the like wherein the reversed layer of the interface cannot be used, as in the case of an electron device using single carriers, a good quantum structure was not able to be formed.

On the other hand, the prior art methods of (2) (using half atom alternate epitaxy on the off-orientation substrate) and (3) (making use of methods such as facet growth and crystal growth inside the channels or the like) showed good crystallization in the interface of fine structure when compared with (1). But the fact that structures of arbitrary configurations could not be obtained due to the restrictions imposed by the crystalline direction of the substrate was a problem.

SUMMARY OF THE INVENTION

The present invention provides a fabrication method for fine structures wherein the carrier trap center density, the optical absorption level or the like are small.

The method comprises the steps of:
having a sharp electro-conducting tip comprised of metal which is in eutectic phase equilibrium with a material of a substrate held in close proximity with the surface of the foregoing substrate;
having a specified electric field applied across the foregoing tip and the substrate surface in vacuum or in air;
having the element constituting the foregoing tip evaporated from the tip and deposited locally on the substrate surface opposite thereto;
then having an alloy liquid drop region formed on the place where the foregoing metal deposit is situated by setting the temperature of the substrate surface above the eutectic temperature of the foregoing metal and the substrate material and also below the melting points of the foregoing metal and the substrate materials respectively; and
have a crystal deposited locally on the foregoing substrate surface at a place where the metal alloy liquid drop region is situated by means of a vapor phase-liquid phase-solid phase (VLS) reaction.

According to this method, the element constituting the tip is evaporated therefrom and deposited on the substrate opposite thereto.

When the substrate with the metal deposited locally is kept at the temperature set as in the foregoing, a state wherein the metal and the substrate material are alloyed and melted, e.g., a metal alloy liquid-drop region will be created locally only at the place where the metal was separated as a crystal.

Next, the gaseous atoms in ambient will be captured by the foregoing metal alloy liquid drop region on account of a VLS reaction and diffused into the metal alloy liquid drop and subsequently separated on the substrate. As a result, it will become possible to obtain a fine structure of an arbitrary configuration with excellent crystallization for applications in quantum effect devices or the like.

BRIEF DESCRIPTION OF THE DRAWINGS

FIG. 1b is a perspective view of fine structures of needle like crystals successively grown on the micro mounds of FIG. 1a.

DETAILED DESCRIPTION OF THE INVENTION

One exemplary embodiment of the present invention relative to a fabrication method of fine structures will be described in Example 1 as follows:

A gold tip with a curvature radius not exceeding several hundred nm was held in a position opposite to the surface of a substrate. The tip was prepared from 0.1 to 1 mm diameter gold wire by electrolytic etching in hydrochloric acid, The tip could have been prepared by means of mechanical cutting and polishing, The substrate was made from a doped silicon single crystal having a flat surface with (111) oriented facets and specific resistance not exceeding approximately 1 k$\Omega$-cm. The magnitude of the specific resistance should be decided in such a way as to pass tunnel current for observation or processing by means of scanning tunneling microscope like equipment which will be described The set-up and the driving mechanism of the processing equipment as was used in the examples were the same ones as employed with a typical scanning tunneling microscope (STM) o In such an STM, the movement of the tip can be controlled freely and very finely with micron precision in the vertical direction and in the horizontal directions as well as by means of a piezo driving mechanism.

This equipment is also provided with the capability of controlling by feedback the vertical piezo driving mechanism through detecting the tunnel current that flows when the tip was brought to close proximity to the substrate and a specified voltage was applied.

First, the place wherein features are to be written was observed by means of this equipment under the STM observation mode. The tip's bias potential $V_t$ was set to around 2 V against the substrate and the tunnel current $I_t$ that flows between the tip and the substrate was set to around 0.5 nA for observation under the constant current mode, Then, the tip's surface scanning was suspended there and a pulse voltage having typically approximately $V_t=3$ to 10 V and a duty time t=several n sec to several hundreds m sec, approximately, was applied. The tip was then moved in the X-axis direction by 50 nm and the same pulse voltage as above was applied in the same manner as in the foregoing. This process associated with the x-axis direction was repeated 10 times. Also, the same process now taking place in the Y-axis direction was repeated 10 times.

As a result, one hundred (10×10=100) feature points were created in a matrix form within an area of 450 nm by 450 nm. When this area was scanned again according to the observation made afterwards, it was confirmed that a mound measuring several nm to several tens of run in diameter and several one tenths nm to several nm in height had been formed on each position of the feature points.

Figure 1A:
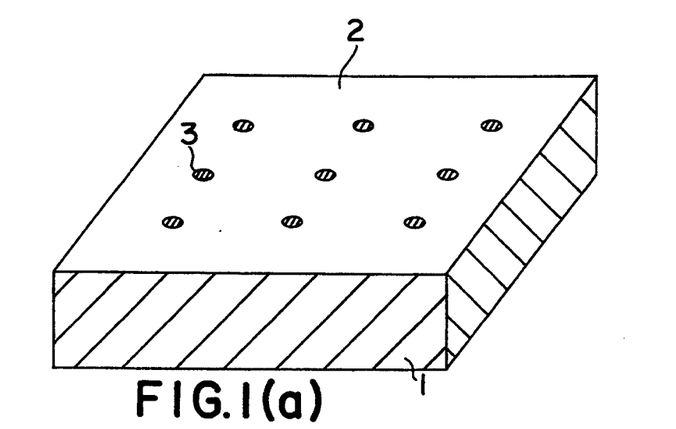
FIG. 1a is a perspective view of micro mounds formed on a substrate according to the fabrication method of fine structures described in Example 1 of the present invention.

Such mounds created in this way are illustrated FIG. 1a, wherein item 1 is a silicon single crystal substrate, item 2 is the substrate surface and item 3 is a micro mound.

In the present example, the pulse voltage was applied in such a way that the tip side takes on a positive bias, but the same result was obtained even when the polarity was reversed. Also, almost the same result was obtained even when the whole process was performed in air.

These mounds are considered to have been formed on the opposing substrate surface by deposition of the gold atoms. The atoms are either evaporated from the tip by ionization on account of an electric field generated across the nm order distance between the tip and the substrate (reaching as high as $10^6$ to $10^7$ V/cm), or evaporated from the tip when its temperature was locally increased, In connection with the applied pulse voltage for creating the mounds, there was observed a threshold voltage $V_{th}$ which ranged from 3 to 5 V in the present example. The suitable voltage $V_t$ for this process should be of the magnitude whereby gold is evaporated from the tips and silicon is hardly evaporated from the substrate, In this cased gold was deposited on the substrate surface equally well in vapor under an arbitrary pressure as it was in vacuum.

Next, a VLS reaction was caused to take place on the foregoing substrate surface.

The process comprised the specific steps as in the following:

The substrate with the mounds formed thereupon was set up in an open tube CVD apparatus and the substrate temperature was elevated above the eutectic temperature in general of the foregoing systems and just below the gold's melting point in general. Typically, the substrate temperature was set between 50° C. and 1000° C.

Under this conditions each of the mound portions of the substrate presented itself locally in a liquid drop like state wherein the silicon substrate and the gold are melted to make an alloy.

Figure 1B:
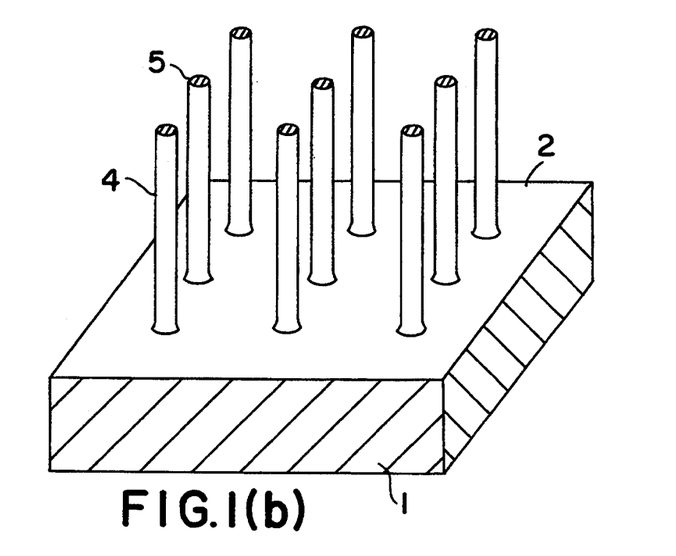

At this stages a mixed vapor comprised of purified hydrogen and SiCl$_4$ mixed according to a specified molar fraction was introduced to supply silicon by a reductive reaction (hydrogen reduction method). This resulted in growth in the vertical direction of a needle like silicon crystal 4 only at the place where the foregoing liquid drop was situated on the silicon substrate 1 as illustrated in FIG. 1b. Besides, some alloy liquid drops 5 remained as a residue on the tip of the needle like crystal.

The mechanism of the foregoing crystal growth is understood as in the following:

Silicon was hardly separated and deposited on the silicon substrate 1 from the foregoing mixed vapor but was efficiently taken into the alloy liquid drops 5.

The captured silicon elements were diffused in the alloy liquid drops 5 and separated successively on the foundation of the silicon substrate surface 1.

In other words, the silicon needle like crystals 4 were epitaxially grown only at limited places of the base substrate.

The growth mechanism in the foregoing is considered as in the following:

The silicon atoms in the foregoing mixed vapor hit the substrate surface and the foregoing alloy liquid drop region at the same rate per unit area and unit time; but the ratio of the atoms that were condensed and contributing to the crystal growth (hereafter referred to as accommodation coefficient) was quite different between the two, On the solid substrate surface where the extent of super-saturation of the exposed mixed vapor is small, the system's temperature is low, or there is little step or absorbed substance that contributes to core formation on the substrate surface (resulting in high thoroughness of the crystal surfaces), its accommodation coefficient will be small. In contrasts with the liquid surface which has very many concavities and convexities when observed microscopically and the capability of capturing many atoms, the accommodation coefficient will be close to 1. Therefore, the silicon atoms in the mixed vapor will be taken into the alloy liquid drop regions predominantly. The captured atoms are diffused in the liquid drops and separated as a crystal at the boundary with the base substrate.

Accordingly, the crystal will be epitaxially grown at limited places of the base substrate.

Besides, the segregation coefficient of gold in the silicon crystal does not exceed $10^{-4}$ and gold is hardly taken into the growing needle like crystal 4.

Therefore, even while the growth is in progress, the alloy liquid drop 5 will always stay on the top portion of the growing crystal, keeping the present growth mechanism intact.

In this ways on the silicon substrate 1, there have been grown a plurality of the needle like crystals 4, each comprised of a silicon single crystal measuring several nm to several tens of nm in diameter with its cross-sectional area being almost equal to the area of the alloy liquid drop 5 marked as a feature on the substrate surface.

$SiCl_4$ was used as the source of silicon in the present example, but additionally the hydrogen reduction method employing $SiHCl_3$ or $SiH_3Cl$ can be equally well used. Also, the thermal decomposition CVD method of $SiH_4$ can be used.

Furthers plasma or electron cyclotron resonance (ECR) can also be utilized in vapor decomposition.

In place of gold, silver was used to make the tip in the same way, and equally good results were obtained when compared with the case where gold was used. With a specified voltage $V_t$ of several volts applied for a specified period t, micro mounds of silver were able to be formed on the silicon substrate.

Then, the silicon substrate with a group of mounds formed thereupon was set up in an open tube chemical vapor deposition (CVD) apparatus and the silicon substrate temperature was set to typically a temperature somewhere between 50° C. and 900° C. and a mixed vapor comprised of purified hydrogen and $SiCl_4$ with a specified molar fraction was introduced into the apparatus.

As a results needle like crystals were grown in the direction perpendicular to the substrate in the same manner as was observed with the case wherein gold liquid drops were used. Each of the needle like crystals showed a configuration tapering more down to the point when compared with the case wherein gold liquid drops were used.

Besides gold and silvers other metals such as copper, nickels iron or the like were used to make a tip and to have the constituting metal evaporated from the tip to form mounds on the silicon substrate. By having silicon grown out of the locally situated liquid drops, needle like fine structures were able to be obtained in the same way as described in the foregoing embodiment example.

With the fine structures, whether as is or coated further over their exteriors with a specified material by means of a CVD method or the like, as described later in another embodiment example, carriers within the fine structures were able to be restricted to moving in the directions within the horizontal plane.

With the needle like fine structures, each having a diameter not exceeding 20 nm or so, the electron state in the directions within the horizontal plane was quantumized and its freedom was limited to existing only in the directions along the longer axis of each tip. Thus, what is called quantum wire structures were created.

These fine structures were grown epitaxially and they were of a good single crystal structure, wherein very few scattering centers or non-radiative recombination centers of carriers caused by various lattice defects within the crystals were existent. Therefore, the needle like fine structures performed as excellent quantum wires.

With the present example, needle like silicon epitaxial crystals were formed.

Figure 2:
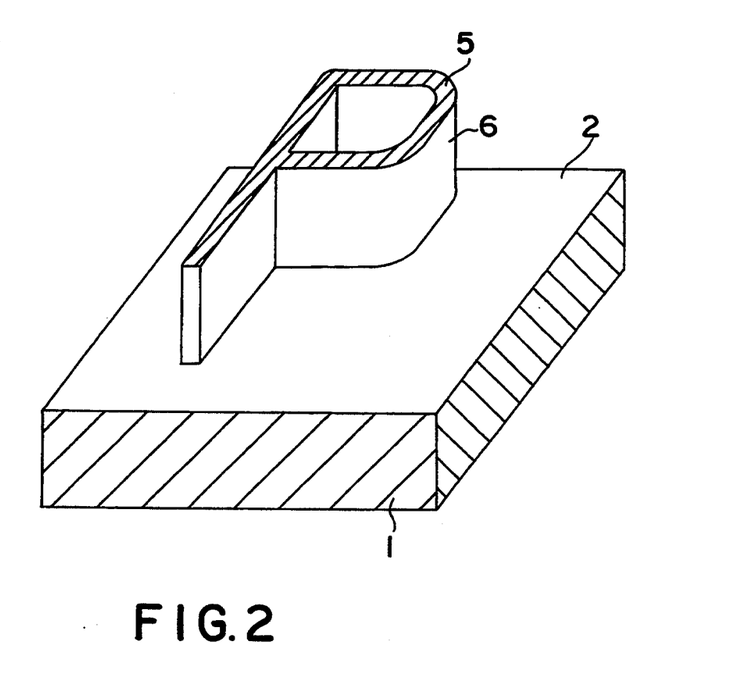
FIG. 2 is a perspective view of a wall like fine structure formed on a substrate as an application of the example described in FIG. 1.

In contrast to this, when the tip was moved on the substrate surface while operated under the specified conditions, a field ridge like continuous micro mound of metal was created along the path swept out by the tip, and when the foregoing VLS reaction was caused to take place thereupon, a wall like fine structure of an arbitrary configuration reflecting the foregoing path was created, as shown in FIG. 2 as an example.

Figure 3:
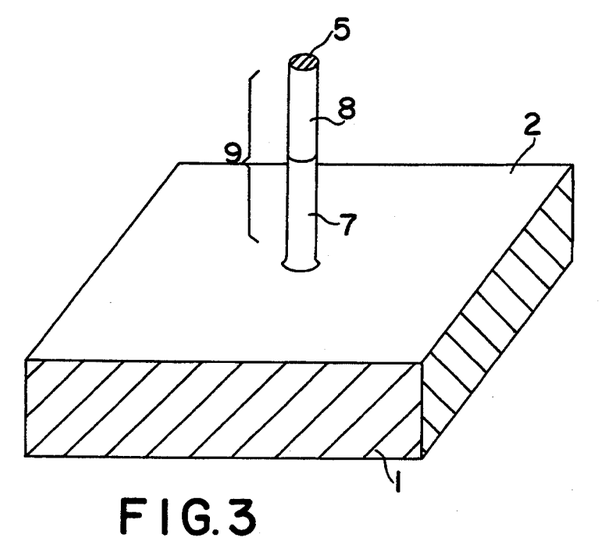
FIG. 3 is a perspective view of the pn junction type fine structure formed on a substrate according no the fabrication method, of fine structures described in Example 2 of the present invention.

Next, Example 2 of the present invention's embodiments will be described with the help of FIG. 3 in the following:

The substrate 1 was made from an n-type low resistance silicon single crystal having a flat surface with (111) oriented facets and mounds measuring several nm to several tens of ran in diameter were created by means of a gold tip according to the same method as Example 1. Then, the substrate with a group of mounds formed thereupon was set up in an open tube CVD apparatus and the substrate temperature was elevated to a temperature somewhere between the eutectic temperature in a broader sense and the gold's melting point in a broader sense for the present system in the same way as Example 1.

Here, what is meant by the melting point or the eutectic temperature in a broader sense is as follows:

When the metal and the substrate material in the foregoing are both in a bulk forms their melting points and eutectic temperatures will show the values which are generally indicated on the equilibrium phase diagram.

However, the state which is involved with the present invention is the case wherein the volume of the aforementioned metal separated is very small and the metal alloy starts to melt even at a temperature lower than the eutectic temperature of that in a bulk form. With a simple metal, its melting point is lowered.

The melting point and the eutectic temperature as referred to in the present invention should be understood to be in a broader sense and inclusive of those in such a micro system as mentioned above.

Next, a mixed vapor comprised of purified hydrogens SiCl$_4$ and a very small amount of PCl$_3$ according to a specified molar fraction was introduced. On account of a reductive reaction, silicon and a very small amount of phosphor were supplied and an n-type silicon crystal 7 doped with a very small, amount of phosphor was grown an the place, where the metal alloy liquid drop 5 was situated, in the direction perpendicular to the substrate with a needle like configuration having almost the same cross-sectional areas as the metal alloy liquid drop 5. The kind of the mixed vapor was changed when the crystal growth reached a suitable height by introducing a mixed vapor comprised of hydrogen, SiCl$_4$ and a very small amount of BBr$_3$ according to a specified molar fraction. On account of a reductive reaction, silicon and a very small amount of boron were supplied and now a p-type silicon crystal 8 doped with boron was grown continuously on the n-type needle like crystal 7. This resulted in the creation of a needle like fine structure 9, typically measuring several nm to several tens of nm in diameter and several nm to several tens of um in length, without much difficultly.

The obtained needle like fine structure 9 was molded by insulating glass for protection and electrodes were formed on the upper most surface and the bottom surface of the substrate. When a voltage was applied across both electrodes, excellent diode characteristics were presented.

Example 3 of the present invention's embodiment will be described in the following:

Although silicon was used as the base substrate in the foregoing Example 1 and Example 2, other materials can also be used when the conditions as described later are satisfied.

First, the case wherein a germanium single crystal was used as the base substrate will be described. The substrate was made from a doped germanium single crystal having a flat surface with (111) oriented facets and specific resistance not exceeding 1 kΩ-cm, approximately. A gold tip was held in vacuum in opposition to the germanium substrate surface and a pulse voltage of $V_t = 3$ to 10 V and application period t=several n sec to several hundreds m sec was applied in the same way as was in Example 1.

Then, micro mounds of gold measuring approximately several rim to several tens of nm in diameter and several one tenths of nm to several nm in height were formed. Although a pulse voltage (to make the top side to be of positive bias) was applied in the present example, the same results were obtained even when the polarity was changed. Besides, almost the same results were obtained even when the processing was conducted in air.

Next, the substrate with the mounds formed thereupon was set up in an open tube CVD apparatus and the substrate temperature was elevated to a temperature somewhere between the present system's eutectic temperature in a broader sense, as described in the foregoing, and the germanium's melting point in a broader sense, typically between 50° C. and 900° C.

Here, a mixed vapor comprised of purified hydrogen and GeCl$_4$ prepared according to a specified molar fraction and then, in the same way as was in Example 1, a needle like germanium crystal measuring approximately several nm to several tens of nm in diameters and having almost the same cross-sectional area as the metal alloy liquid drop region marked on the substrate, was grown in the direction perpendicular to the substrate surface.

Now, an exemplary embodiment wherein a compound semiconductor was employed as the base substrate will be described. The substrate was made from a doped GaAs single crystal having a flat surface with (111)B oriented facets and specific resistance not exceeding 1 kΩ-cm, approximately. A gold tip was held in vacuum in opposition to the germanium substrate surface and a specified pulse voltage was applied in the same way as was in Example 1, and then micro mounds of gold measuring approximately several nm to several tens of nm in diameter and several one tenths of nm to several nm in height were formed on the GaAs substrate surface. Although a pulse voltage to make the tip side to be of positive bias was applied in the present example, the same results were obtained even when the polarity was changed. Besides, almost the same results were obtained even when the processing was conducted in air.

Next, the substrate with the mounds formed thereupon was set up in a metal organic vapor phase epitaxy (MOVPE) apparatus and the substrate temperature was elevated to a temperature somewhere between approximately 100° C. and 550° C. by means of a high frequency heating method.

Here, a mixed vapor of trimethylindium and hydrogen diluted arsine prepared under a certain specified pressure and according to a specified molar fraction was introduced.

Then, in the same way as was in Example 1, a needle like InAs crystal measuring approximately several nm to several tens of rim in diameter, and having almost the same cross-sectional area as the metal alloy liquid drop region marked on the substrate, was grown in the direction perpendicular to the substrate surface.

The grown crystal was a single crystal of good quality. Particularly, a good result in terms of selective growth was obtained under the growth temperature not exceeding 500° C. In other words, it was confirmed that the crystal growth on the substrate surface which is in contact with the alloy liquid drop region progresses at least twice as fast as the growth of a substance formed on the substrate surface not in contact with the alloy liquid drop region does under the foregoing growth temperature. In the foregoing example, the needle like InAs crystal was heteroepitaxially grown on the GaAs substrate, but also a GaAs micro needle like crystal was able to be formed homoepitaxially on the GaAs substrate according to the same method.

Also, other two-element or multi-element system compound semiconductors of the III–V group or II–VI group, such as GaP or the like, for example, were able to be grown to a micro needle like crystal according to the same method. Not only GaAs but also other two-element or multi-element system compound semiconductors of the III–V group, II–VI group, IV—IV group or the like were able to be used as the substrate material, too.

Besides, the extremely fine structures were able to be formed between single atoms or compound semiconductors of different groups by heteroepitaxial growth as indicated by growth of a GaAs micro needle like crystal on a Si substrate surfaces for example.

Example 4 of the present invention's embodiment will be described with the help of FIG. 4 in the following:

As the base substrate a p-type GaAs single crystal substrate 10 having a flat surface with (111)B oriented facets and low resistance was used.

In the same way as performed in Example 1, a gold tip was held over the GaAs substrate in opposition to the substrate surface and the specified pulse voltage was applied to form a micro mound of gold measuring approximately several nm to several tens of run in diameter and several one tenths of nm to several nm.

Then, the substrate was set up in a MOVPE apparatus and the substrate temperature was elevated to a temperature approximately between 100° C. and 550° C. by means of a high frequency heating method.

Here, a mixed vapor of trimethylaluminum, trimethylgallium and hydrogen diluted arsine further added with a very small amount of diethylzinc prepared under a specified pressure and according to a specified molar fraction was introduced.

Then, in the same way as was in Example 1, a zinc doped p-type AlGaAs needle like crystal 11 having almost the same cross-sectional area as the metal alloy liquid drop region marked on the substrate surface and measuring several nm to several tens of nm, approximately, was grown in the direction perpendicular to the substrate.

At the stage wherein the crystal was grown to a suitable height, the kind of the mixed vapor was changed to a mixed vapor of trimethylgallium and hydrogen diluted arsine further added with a very small amount of diethylzinc prepared under a specified pressure and according to a specified molar fraction.

Then, a p-type GaAs region 12 was formed continuously on the foregoing p-type AlGaAs needle like crystal 11. After this GaAs region was grown to a suitable length, the vapor was again changed to a mixed vapor of trimethyl-aluminum, trimethylgallium and hydrogen diluted arsine added with a very small amount of hydrogen selenide prepared under a specified pressure and according to a molar fraction. As a result, an n-type AlGaAs region doped with selenium 13 was continuously grown halfway on the foregoing needle like crystal.

Accordingly, a needle like fine structure 14 was obtained having regions of differing conduction types and bandgaps, formed on a p-type GaAs substrate 10 and comprised of p-type AlGaAs/p-type GaAs/n-type AlGaAs in that order, The structure 14 measured approximately several nm to several tens of nm in diameter and several nm to several tens of um in length.

The obtained double hetero type needle like fine structure 14 was molded by insulating glass 15 for protection. Then a Au/Ge/Ni alloy electrode 16 and a Au/Zu alloy electrode 17 were formed on the upper most surface and the bottom surface of the substrate respectively. When a regular bias voltage was applied across the electrodes, light was irradiated efficiently.

Figure 4:
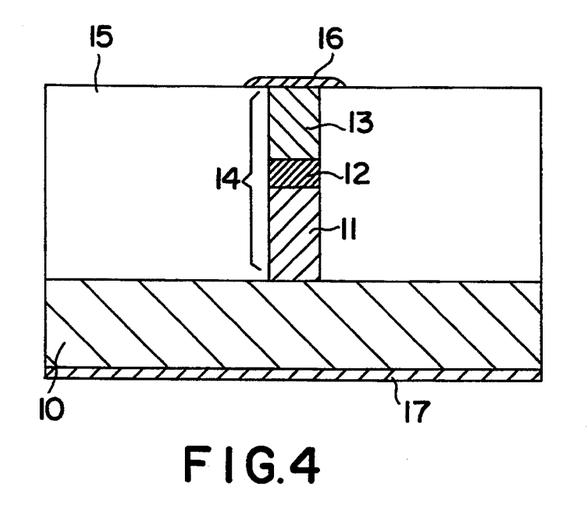
FIG. 4 is a schematic cross-sectional illustration of a needle like fine structure comprised of three regions and formed on a substrate according to the fabrication method of fine structures described in Example 4 of the present invention.

According to another exemplary embodiment of the present inventions a needle like fine structure comprising three regions of AlGaAs/GaAs/AlGaAs formed on a GaAs substrate in that order as shown in FIG. 4, for example was able to be fabricated by the same method as the foregoing. This structure measured around 10 nm and less in diameter with the GaAs region not exceeding 20 nm, approximately, in length.

This GaAs region measures around 20 nm and less in both the direction within the horizontal plane and the vertical direction, and the electron state therein is quantitized in three-dimensions with a resultant formation of the so called quantum box.

Figure 5:
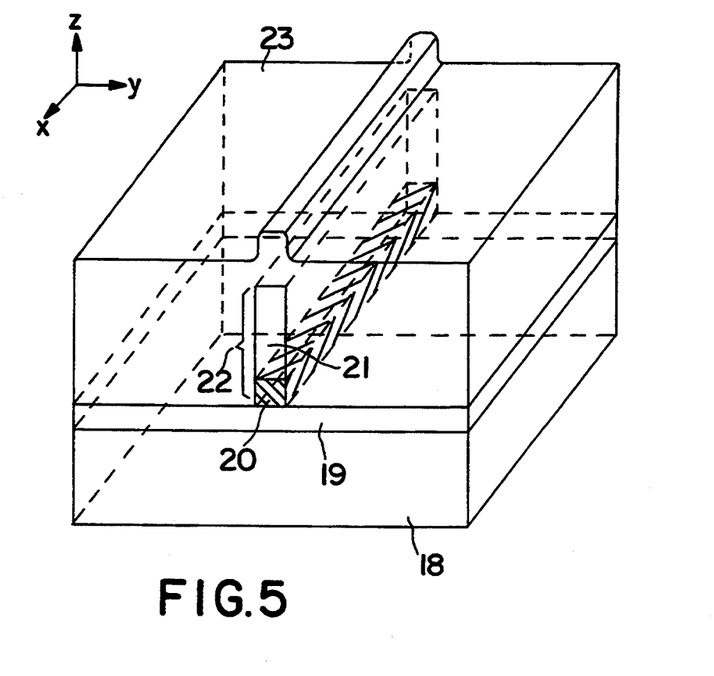
FIG. 5 is a perspective view of a fine structure for a quantum wire formed on a substrate according to the fabrication method of fine structures described in Example 5 of the present invention.

As Example 5 of the present invention's embodiments, a successful formation of quantum wire oriented in the direction parallel to the substrate will be described with the help of FIG. 5 in the following:

The base substrate was made from a CaAs single crystal substrate 18 having a flat surface with (111)B oriented facets and low resistance and thereupon was formed an AlGaAs buffer layer 19 having a specified thickness.

By the same method as was used in Example 1, a gold tip was held over the substrate surface in opposition thereto and moved in the direction parallel to the substrate surface while a pulse voltage was applied repeatedly with a specified duty cycle.

Then, on the substrate surface was formed a micro ridge of gold measuring approximately several nm to several tens of nm in width and several one tenths of rim to several nm in height was created.

Then, this substrate was set up in the MOVPE apparatus and the substrate temperature was elevated from outside to a temperature approximately between 100° C. and 550° C. by means of a high frequency heating method.

When a mixed vapor of trimethylgallium and hydrogen diluted arsine prepared under a specified pressure and according to a specified molar fraction was introduced, a belt like structure of GaAs 20 having the same width as the ridge was grown at the same place where the ridge was situated.

When the height of the ridge was grown to around 20 nm or less, the kind of the mixed vapor was changed to a mixed vapor of trimethylaluminum, trimethylgallium and hydrogen diluted arsine prepared under a specified pressure and according to a specified molar fraction.

Then, an AlGaAs region 21 was continuously grown over the foregoing GaAs belt like fine structure 20 after changing halfway with a resultant formation of a layered fine structure 22 comprised of these.

After this, the crystal forming condition was altered. More specifically, the conditions were changed so as to make the crystal epitaxially grow directly from the surface of the founding AlGaAs buffer layer 19 by having the substrate temperature elevated to around 550° C. and more to the like.

Under this condition, an AlGaAs coating layer 23 was formed all over to a specified thickness.

This growth mode wherein the growth process was performed all over the regions might have been carried out by means of a molecular beam epitaxial growth method or the like. Accordingly, a GaAs belt like fine structure 20 with its cross-section measuring around 20 nm and less both longitudinally and laterally and with its four sides surrounded by an AlGaAs crystal serving as a potential barrier was completed.

The interfaces existent between the GaAs belt like fine structure 20 and the surrounding AlGaAs crystal became almost heteroepitaxial with respect to each other, not only in the horizontal interface, but also in the vertical interface.

With this structure, the electron's freedom of movement remained only in the x axis direction and the electron state in the y axis and z axis directions was quantumized, resulting in a formation of a quantum wire structure.

Since the present fine structure was made from a good quality single crystal that was grown according to the epitaxial mechanism in the same way as was employed in the foregoing embodiment examples, the crystal had very few scattering centers and non-radiative recombination centers of carriers that were caused by various lattice defects.

Also, the interfaces with the surrounding AlGaAs crystals are excellent and the interface state density is small. Therefore, this will serve as a good quantum wire.

Figure 6:
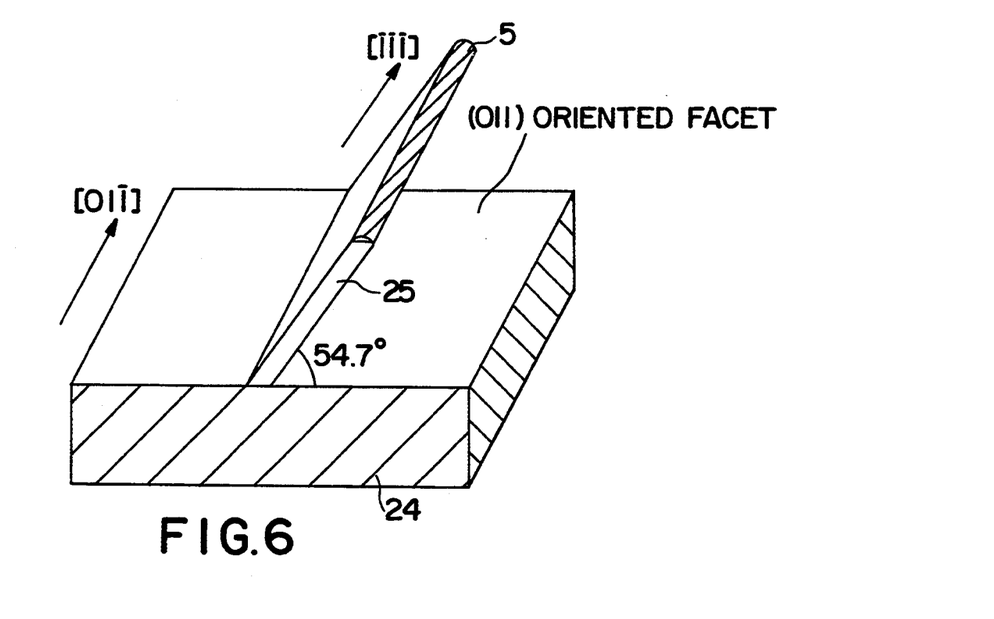
FIG. 6 is a perspective view of a fine structure formed on a substrate in an angle of 54.7° to the substrate in accordance with the fabrication method of fine structures described in Example 6 of the present invention.

Example 6 of this invention's embodiment will be described with the help of FIG. 6 in the following:

With the foregoing example, the crystal orientation of the base substrate, wherein the growth speed of the crystal locally grown is fastest, was the same as the facet orientation of the substrate surface. In that case, the needle like or wall like fine structure was grown in the direction perpendicular to the substrate surface.

On the other hand, by making an angle between the two, it will become possible to have the fine structure grown at an arbitrary angle other than a right angle to the substrate surface. FIG. 6 shows such a case, wherein a GaAs substrate 24 with (011) oriented facets was used.

In the same way as was in the foregoing examples, a gold tip was held over the substrate surface in opposition thereto and moved in the direction of [011] of the substrate while a pulse voltage was applied at a specified duty cycle. Then, a micro ridge of gold measuring approximately several nm to several tens of nm in width was observed to have been created on the substrate surface.

As the next step, the substrate was set up in a MOVPE apparatus and the substrate temperature was elevated to a temperature adjusted to fall between 100° C. and 550° C. by means of a high frequency heating method. Then, a mixed vapor of trimethylgallium and hydrogen diluted arsine prepared under a specified pressure and according to a specified molar fraction was introduced.

An extremely thin GaAs wall like structure 25 was grown at the place where the foregoing ridge was situated and the wall made an angle of 54.7° to the substrate surface.

Example 7 of the present invention's embodiment will be described in the following:

With all the foregoing examples, descriptions were made of a method of having a metal element itself that constitutes a tip, evaporated from the tip of said metal and deposited on a substrate to form a micro mound of said metal.

On the other hand, according to the present exemplary embodiment, a sharp tip was held at a position close and opposite to a substrate in a vapor containing a specified metal element. A tunnel current or a field emission current was passed across the tip and the substrate with resultant decomposition of the vapor and formation of micro mounds on the substrate.

More specifically, a vapor of $C_5H_5Pt(C_3H_5)$ was introduced to a chamber and its pressure was set to typically $5 \times 10^{-6}$ to 760 Torr. A substrate was made from a low resistance silicon single crystal with a flat surface and (111) oriented facets. In the aforementioned chamber, a tungsten tip was held at a position close and opposite to the silicon substrate. A pulse voltage having typically a sample voltage $V_3 = 1$ to 10 V approx. and an applied pulse time t=several n sec to several hundreds of m sec approx. was applied at a certain specified duty cycle with resultant formation of a micro mound measuring several nm to several hundreds of nm in diameter.

This micro mound was considered to be comprised of Pt which was deposited after decomposition of the foregoing vapor on account of a tunnel current or a field emission current. With the present exemplary embodiment, the pulse voltage was applied so as to make the sample side to be positive biased but, even when the polarity was changed, the same results were obtained.

Then, according to the same process as the foregoing, a needle like silicon fine structure was realized.

The organometallic vapor as used in the present example can be Pt containing vapors of a prescribed specification other than the aforementioned $C_5H_5Pt(C_3H_5)$ and also can be different organometallic vapors containing Au, Ag, Cu, Pd, Ni or the like.

Also, Pt, Au or the like can be used as the tip in place of W.

Besides, the present exemplary embodiment was effectively applied in the case wherein other single element semiconductors or compound semiconductors than silicon were involved.

Example 8 of the present invention will be described in the following:

A PtIr tip and a silicon (111) substrate were placed in a diluted solution of $KAu(CN)_2$. The tip was held at a position close to the substrate while a negative sample voltage $V_S$ reading typically $V_s = -1$ to $-10$ V (approximately) was applied with resultant formation of a micro mound. The micro mound measured several nm to several hundreds of nm, approximately in diameter.

This micro mound was considered to have been made from the Au ions which had been contained in the foregoing solution and were neutralized by a tunnel current or a field emission current and deposited.

Then, according to the same process as the foregoing embodiment example, a needle like silicon fine structure was realized.

The solution used in the present embodiment example can be other Au containing solutions of a prescribed specification than the aforementioned $KAu(CN)_2$ and also can be different solutions containing Ag, Cu, Pt, Pd, Ni or the like. Also, W, Au or the like can be used as the tip in place of PtIr.

The substrate surface may be exposed directly to a vapor. The vapor includes at least one of the group consisting of a halogenide, an organometallic compound and a hydride which contains at least a specified element (e.g., the substrate material), under a specified pressure. The vapor may be decomposed first by using energy from heat, electro-magnetic waves or the like. The specified element dissolves into the alloy liquid drop region.

Besides, the present exemplary embodiment was effectively applied to the case wherein other single element semiconductors or compound semiconductors than silicon were involved.

In dealing with the foregoing exemplary embodiments, the conditions required of the metal that composes a micro mound formed on a substrate and also the substrate material are considered to include the following:

The aforementioned metal should be capable of being in an eutectic phase equilibrium with the substrate material and the eutectic temperature should be lower than the melting point of any of the foregoing metal and the substrate material.

Besides, the segregation coefficient of the above metal in the micro crystalline materials wherein said metal is separated, should be as small as possible to make it difficult for said metal to be taken into said crystalline material with a resultant great contribution to formation of the needle like or wall like fine structures.

On account of the present invention's fabrication methods it was made possible to create readily a micro pillar of less than several tens of nm in diameter or a micro wall of less than several tens of nm in thickness.

As described in the foregoing, the present fabrication method makes it possible to create fine structures of any configurations, at least within a two-dimensional plane, and consequently makes it possible to realize a fine structured device which has been difficult to fabricate according to the prior art fine structure fabrication method of applying a half atom layer alternating epitaxial growth or a facet growth onto an off oriented substrate.

In addition, these fine structures are made from the single crystals of excellent quality prepared according to the epitaxial growth mechanism.

When compared with the prior art fine structures prepared by means of focused ion beam exposure or the like, these fine structures have very few carrier trap centers, light absorption levels and the like due to lattice defects. These fine structures as they are; or as coated with a specified material by means of CVD, MBE or the like, for example, can effectively contain carriers therein.

Accordingly, the present fabrication method has made it possible to produce fine structures having few carrier trap centers and light absorption levels and also arbitrary configuration at least within a two-dimensional plane, otherwise impossible with the prior art fabrication method of fine structures.

What is claimed:

1. A method for fabricating fine structures, comprising the steps of:
   (a) providing a substrate formed from a substrate material and a sharp electro-conducting tip positioned close to a surface of the substrate, the tip containing a metal that is capable of being in eutectic phase equilibrium with the substrate material;
   (b) applying a specified electric field between the tip and the substrate, to evaporate the metal from the tip and deposit the metal as a micro mound or micro ridge in a region on the surface of the substrate;
   (c) heating the surface of the substrate to a temperature that is above a eutectic temperature of the metal and the substrate, the temperature of the surface being below the respective melting points of the metal and the substrate, so that the metal and substrate material in the region on the surface of the substrate where the micro mound or micro ridge of metal is deposited combine to form an alloy liquid drop; and
   (d) initiating a vapor phase-liquid phase-solid phase reaction to form a separate crystal from the alloy at the site of said liquid drop in the region on the surface of the substrate.

2. A method according to claim 1, wherein step (d) includes the steps of:
   (1) providing a vapor comprising at lease one material selected from the group consisting of a halogenide, an organometallic compound and a hydride which contains at least a specified element;
   (2) exposing the surface of the substrate to the vapor; and
   (3) dissolving the specified element into the alloy.

3. A method according to claim 2, wherein step (d) includes, between steps (1) and (2), the step of adding energy to the vapor to decompose the vapor.

4. A method according to claim 2, wherein the substrate has a crystal growth speed in the region on the surface of the substrate and a surface growth speed outside of the region, the crystal growth speed being twice as fast as the surface growth speed.

5. A method according to claim 2, wherein step (d) includes the step of replacing the vapor with a further vapor while forming the crystal, the further vapor differing from the vapor.

6. A method according to claim 1, wherein step (b) includes moving the tip over the surface of the substrate while depositing the metal, to form a micro ridge of metal on the surface of the substrate.

7. A method according to claim 1, further comprising, after step (d), forming a further crystal at least on a remaining portion of the surface of the substrate outside of the region.

8. A method according to claim 1, wherein the metal comprises at least one material selected from the group consisting of gold, silver, copper, platinum, palladium, nickel, iridium, rhodium, cobalt, osmium, ruthenium, iron, mercury, cadmium and zinc.

9. A method according to claim 1, wherein the metal has a segregation coefficient in the crystal that is less than 1.

10. A method according to claim 1, wherein the crystal is formed from one of a single element semiconductor and a compound semiconductor.

11. A method according to claim 1, wherein the substrate is formed from one of a single element semiconductor and a compound semiconductor.

12. A method according to claim 1, wherein a portion of the surface of the substrate that is in the region on the surface of the substrate is formed from a single crystal.

13. A method according to claim 1, wherein step (a) includes the step of selecting a substrate having a crystalline orientation, such that in step (d) the separate crystal is formed at an angle that is not perpendicular to the surface of the substrate.

14. A method for fabricating fine structures, comprising the steps of:
   (a) placing a substrate formed from a substrate material and a sharp electro-conducting tip in a vapor, the vapor including a metal that is capable of being in eutectic phase equilibrium with the substrate material;
   (b) positioning the tip close to a surface of the substrate;
   (c) applying a specified electric field between the tip and the substrate so that a current passes between the substrate and the tip to deposit the metal as a micro mound or micro ridge in a region on the surface of the substrate, the current being selected from the group consisting of a tunnel current and a field emission current;
   (d) heating the surface of the substrate to a temperature that is above a eutectic temperature of the metal and the substrate, the temperature of the surface being below the respective melting points of the metal and the substrate, so that the metal and substrate material in the region on the surface of the substrate where the micro mound or micro ridge is deposited combine to form an alloy liquid drop; and (e) initiating a vapor phase-liquid phase-solid phase reaction to form a separate crystal from the alloy at the site of said liquid drop in the region on the surface of the substrate.

15. A method according to claim 14, wherein:

the vapor includes at least one material selected from the group consisting of a halogenide, an organometallic compound and a hydride which contains at least a specified element; and step (e) includes dissolving the specified element into the alloy.

16. A method according to claim 15, wherein step (c) includes decomposing the vapor.

17. A method according to claim 15, wherein the substrate has a crystal growth speed in the region on the surface of the substrate and a surface growth speed outside of the region, the crystal growth speed being twice as fast as the surface growth speed.

18. A method according to claim 14, wherein step (e) includes the step of replacing the vapor with a further vapor while forming the separate crystal, the further vapor differing from the vapor.

19. A method according to claim 14, wherein step (c) includes moving the tip over the surface of the substrate while depositing the metal, to form a micro ridge of metal on the surface of the substrate.

20. A method according to claim 14, further comprising, after step (e), forming a further crystal at least on a remaining portion of the surface of the substrate outside of the region on the surface of the substrate.

21. A method according to claim 14, wherein the metal comprises at least one material selected from the group consisting of gold, silver, copper, platinum, palladium, nickel, iridium, rhodium, cobalt, osmium, ruthenium, iron, mercury, cadmium and zinc.

22. A method according to claim 14, wherein the metal has a segregation coefficient in the crystal that is less than 1.

23. A method according to claim 14, wherein the crystal is formed from one of a single element semiconductor and a compound semiconductor.

24. A method according to claim 14, wherein the substrate is formed from one of a single element semiconductor and a compound semiconductor.

25. A method according to claim 14, wherein a portion of the surface of the substrate that is in the region on the surface of the substrate is formed from a single crystal.

26. A method according to claim 14, wherein step (a) includes a step of selecting a substrate having a crystalline orientation, such that in step (e) the separate crystal is formed at an angle that is not perpendicular to the surface.

27. A method for fabricating fine structures, comprising the steps of:

(a) placing a substrate formed from a substrate material and a sharp electro-conducting tip in a solution, the solution including a metal that is capable of being in eutectic phase equilibrium with the substrate material;

(b) positioning the tip close to a surface of the substrate;

(c) applying a specified electric field between the tip and the substrate so that a current passes between the substrate and the tip to deposit the metal as a micro mound or micro ridge in a region on the surface of the substrate, the current being selected from the group consisting of a tunnel current, a field emission current and an ion current;

(d) heating the surface of the substrate to a temperature that is above a eutectic temperature of the metal and the substrate, the temperature of the surface being below the respective melting points of the metal and the substrate, so that the metal and substrate material in the region on the surface of the substrate where the micro mound or micro ridge is deposited combine to form an alloy liquid drop; and (e) initiating a vapor phase-liquid phase-solid phase reaction to form a separate crystal from the alloy at the site of said liquid drop in the region on the surface of the substrate.

28. A method according to claim 27, wherein step (e) includes the steps of:

(1) providing a vapor comprising at least one material selected from the group consisting of a halogenides an organometallic compound and a hydride which contains at least a specified element;

(2) exposing the surface of the substrate to the vapor; and (3) dissolving the specified element into the alloy.

29. A method according to claim 28, wherein step (e) includes, between steps (1) and (2), the step of adding energy to the vapor to decompose the vapor.

30. A method according to claim 28, wherein the substrate has a crystal growth speed in the region on the surface of the substrate and a surface growth speed outside of the region, the crystal growth speed being twice as fast as the surface growth speed.

31. A method according to claim 28, wherein step (e) includes the step of replacing the vapor with a further vapor while forming the crystal, the further vapor differing from the vapor.

32. A method according to claim 27, wherein step (c) includes moving the tip over the surface of the substrate while depositing the metal, to form a micro ridge of metal on the surface of the substrate.

33. A method according to claim 27, further comprising, after step (e), forming a further crystal at least on a remaining portion of the surface of the substrate outside of the region.

34. A method according to claim 27, wherein the metal comprises at least one material selected from the group consisting of gold, silver, copper, platinum, palladium, nickel, iridium, rhodium, cobalt, osmium, ruthenium, iron, mercury, cadmium and zinc.

35. A method according to claim 27, wherein the metal has a segregation coefficient in the crystal that is less than 1.

36. A method according to claim 27, wherein the crystal is formed from one of a single element semiconductor and a compound semiconductor.

37. A method according to claim 27, wherein the substrate is formed from one of a single element semiconductor and a compound semiconductor.

38. A method according to claim 27, wherein a portion of the surface of the substrate that is in the region on the surface of the substrate is formed from a single crystal.

39. A method according to claim 27, wherein step (a) includes the step of selecting a substrate having a crystalline orientation, such that in step (e) the separate crystal is formed at an angle than is not perpendicular to the surface.

* * * * *

UNITED STATES PATENT AND TRADEMARK OFFICE
CERTIFICATE OF CORRECTION

PATENT NO. : 5,381,753
DATED : Jan. 17, 1995
INVENTOR(S) : Okajima et al.

It is certified that error appears in the above-identified patent and that said Letters Patent is hereby corrected as shown below:

At Col. 16, Claim 28, line 20, delete "halogenides" and insert therefor —halogenide,—.

Signed and Sealed this

Sixth Day of June, 1995

Attest:

BRUCE LEHMAN

Attesting Officer    Commissioner of Patents and Trademarks